(12) United States Patent
Ozog

(10) Patent No.: US 11,529,717 B2
(45) Date of Patent: Dec. 20, 2022

(54) SUPPORTING A CONTOURED SHEET OF MATERIAL DURING MACHINING OPERATIONS

(71) Applicant: The Boeing Company, Chicago, IL (US)

(72) Inventor: Stefan Ozog, Winnipeg (CA)

(73) Assignee: The Boeing Company, Chicago, IL (US)

( * ) Notice: Subject to any disclaimer, the term of this patent is extended or adjusted under 35 U.S.C. 154(b) by 854 days.

(21) Appl. No.: 16/297,578

(22) Filed: Mar. 8, 2019

(65) Prior Publication Data

US 2020/0282525 A1 Sep. 10, 2020

(51) Int. Cl.
*B25B 11/00* (2006.01)
*H01L 21/683* (2006.01)
*B23B 47/28* (2006.01)

(52) U.S. Cl.
CPC .......... *B25B 11/005* (2013.01); *B23B 47/287* (2013.01); *H01L 21/6838* (2013.01); *B23B 2215/04* (2013.01); *B23B 2270/62* (2013.01)

(58) Field of Classification Search
CPC ... B25B 11/005; H01L 21/6838; B23Q 3/088; B26D 7/018
USPC ............................................. 269/21; 83/451
See application file for complete search history.

(56) References Cited

U.S. PATENT DOCUMENTS

| 2,756,644 A | 7/1956 | Steele | |
| 4,597,228 A * | 7/1986 | Koyama | H01L 21/6838 451/388 |
| 5,141,212 A * | 8/1992 | Beeding | B25B 11/005 269/21 |
| 2011/0135411 A1* | 6/2011 | Inman | B23Q 11/0046 408/67 |
| 2012/0063862 A1 | 3/2012 | Epplin et al. | |

FOREIGN PATENT DOCUMENTS

| EP | 0147094 A2 | 7/1985 |
| GB | 2172822 * | 3/1985 |
| GB | 2172822 A | 10/1986 |

OTHER PUBLICATIONS

Extended European Search Report dated Sep. 10, 2020 regarding European Application No. 20151881.8; 7 pgs.

\* cited by examiner

*Primary Examiner* — Mahdi H Nejad
(74) *Attorney, Agent, or Firm* — Yee & Associates, P.C.

(57) ABSTRACT

A machining support configured to reduce spring back of a sheet following a machining operation on the sheet is presented. The machining support comprises a porous material with a plurality of surfaces including a support surface having a contour configured to contact and support the sheet; sealing material covering each of the plurality of surfaces except the support surface; and a vacuum port configured to provide a vacuum to the porous material.

20 Claims, 9 Drawing Sheets

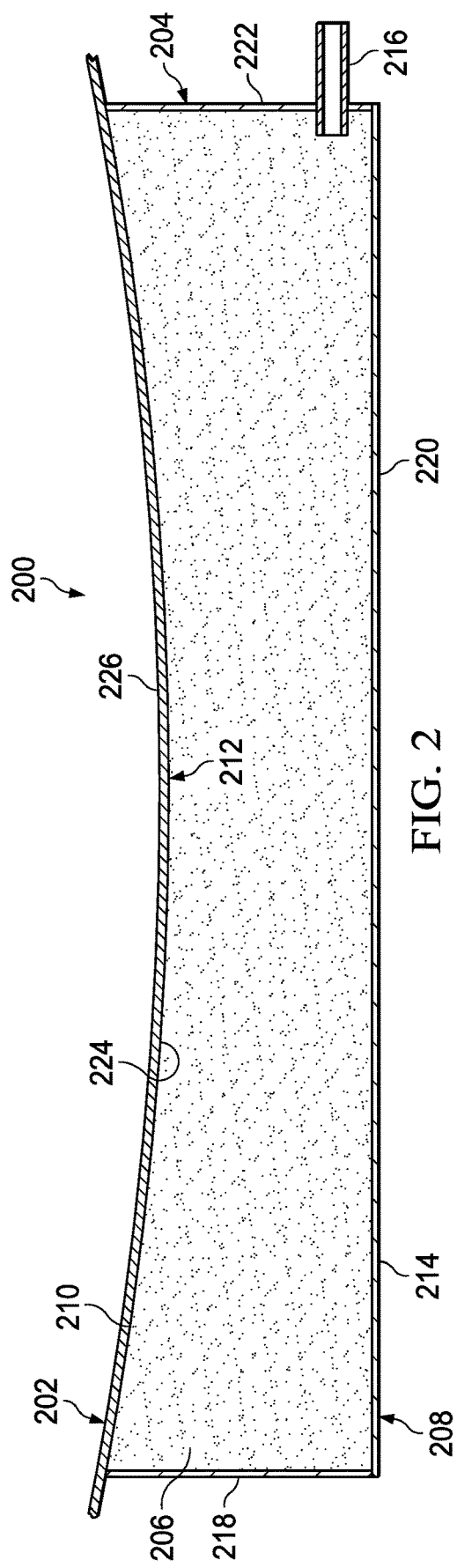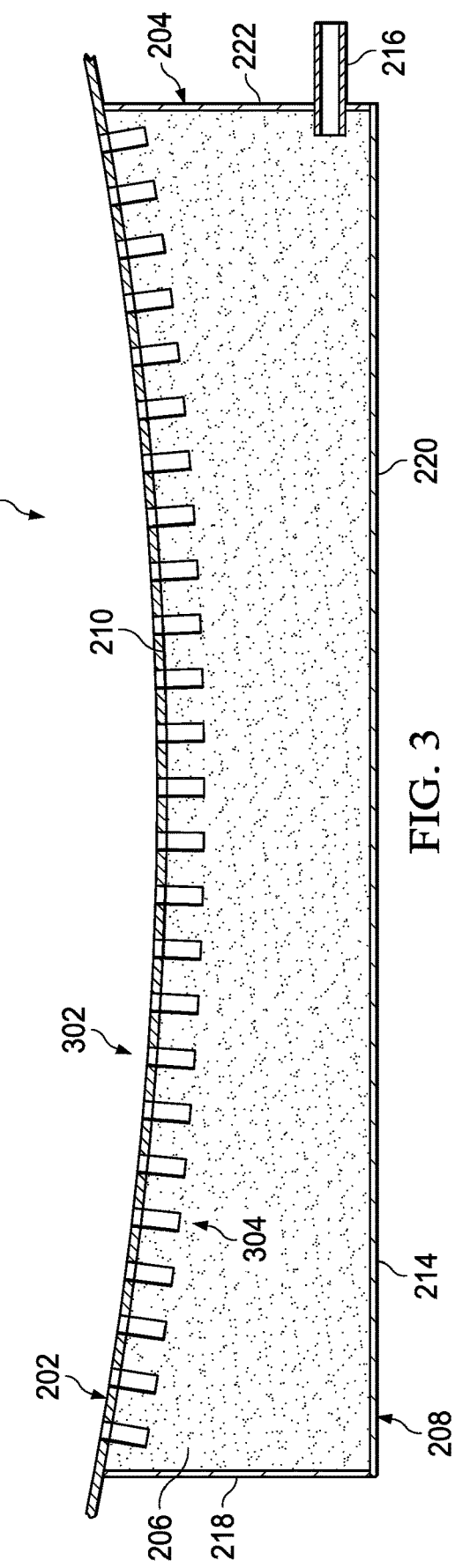

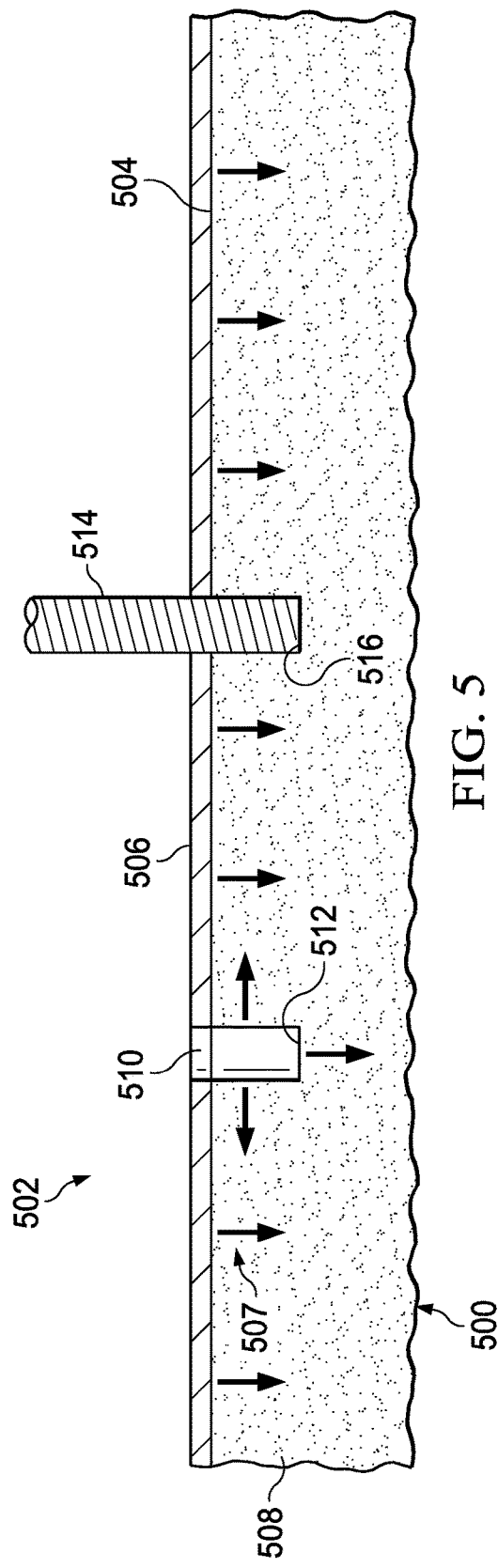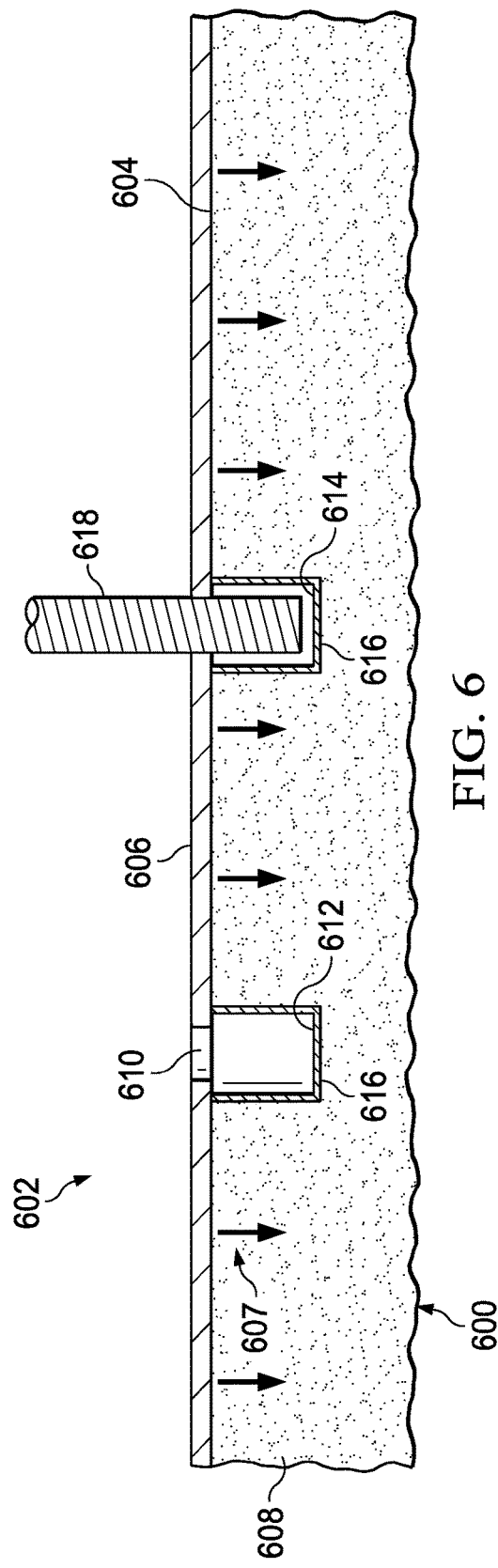

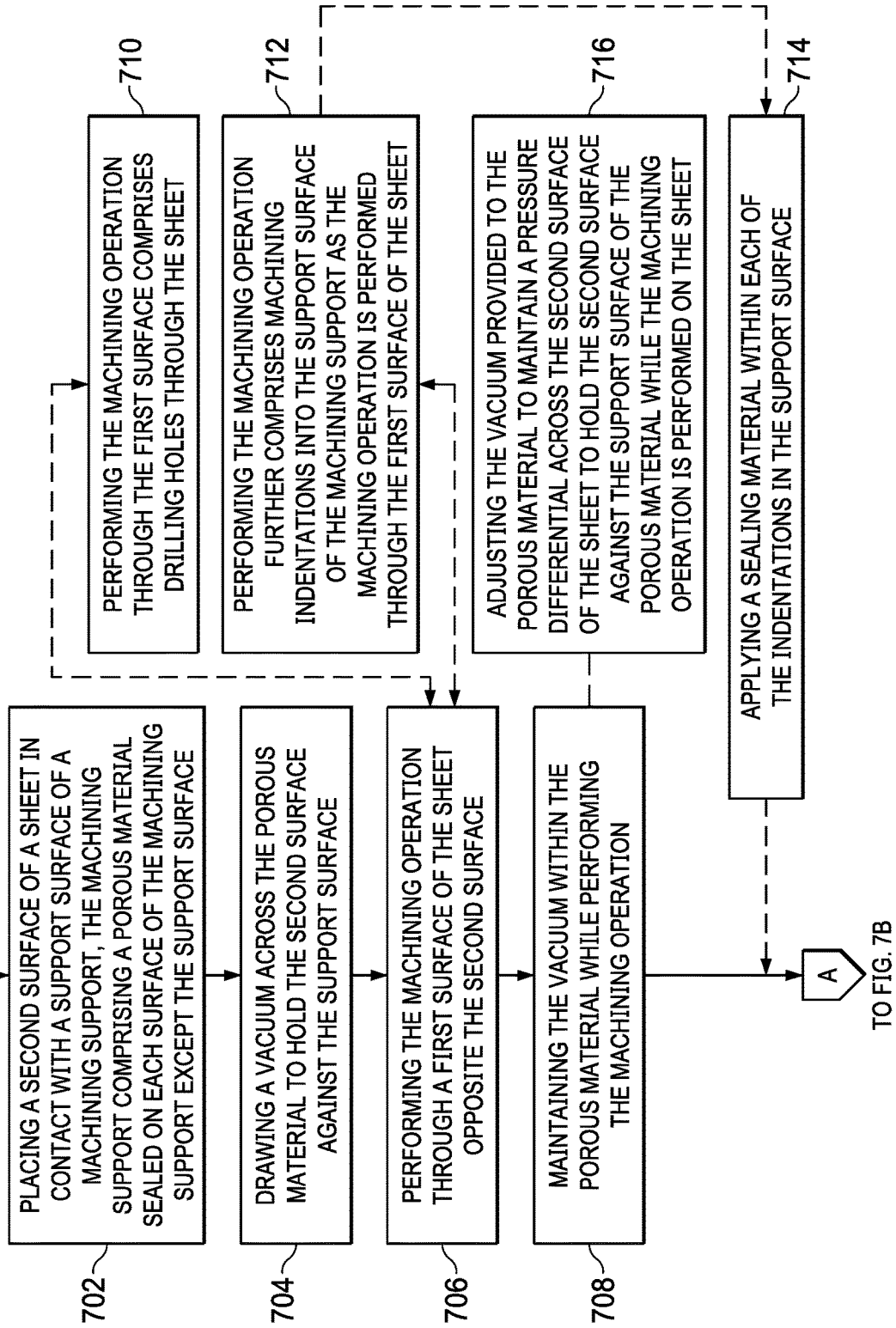

SUPPORTING A CONTOURED SHEET OF MATERIAL DURING MACHINING OPERATIONS

BACKGROUND INFORMATION

1. Field

The present disclosure relates generally to machining operations on sheets, and more specifically to supporting a sheet of material during machining operations.

2. Background

During manufacturing of sheet components, machining operations, such as drilling or milling may be performed on a pre-formed sheet of material. The initial machining force from the drill bit on an unsupported portion of a sheet and the resulting spring back of the sheet may result in less than desired hole quality. The initial machining force from the drill bit and the resulting spring back of the sheet can undesirably affect the drill bit, including potentially breaking the drill bit.

Therefore, it would be desirable to have a method and apparatus that takes into account at least some of the issues discussed above, as well as other possible issues.

SUMMARY

An illustrative embodiment of the present disclosure provides a method of reducing spring back of a sheet following a machining operation on the sheet. A vacuum is drawn across a porous material of a machining support to hold a second surface of the sheet against a support surface of the machining support, the porous material of the machining support sealed on each surface except the support surface. The vacuum is maintained within the porous material while performing the machining operation through a first surface of the sheet opposite the second surface.

Another illustrative embodiment of the present disclosure provides a method of reducing spring back of a sheet following a machining operation on the sheet. A second surface of the sheet is placed in contact with a support surface of a machining support, the machining support comprising a porous material sealed on each surface of the machining support except the support surface. A vacuum is drawn across the porous material to hold the second surface against the support surface. The machining operation is performed through a first surface of the sheet opposite the second surface. The vacuum is maintained within the porous material while performing the machining operation.

Yet another illustrative embodiment of the present disclosure provides a machining support configured to reduce spring back of a sheet following a machining operation on the sheet. The machining support comprises a porous material with a plurality of surfaces including a support surface having a contour configured to contact and support the sheet; sealing material covering each of the plurality of surfaces except the support surface; and a vacuum port configured to provide a vacuum to the porous material.

A further illustrative embodiment of the present disclosure provides a method of forming a machining support configured to reduce spring back of a sheet following a machining operation on the sheet. Porous material is shaped to create a plurality of surfaces including a support surface having a contour configured to contact and support the sheet. A sealing material is applied to each of the plurality of surfaces except the support surface.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 2 is an illustration of a cross-sectional view of a sheet on a machining support configured to reduce spring back following machining operations in accordance with an illustrative embodiment;

FIG. 3 is an illustration of a cross-sectional view of a sheet on a machining support after machining operations were performed on the sheet in accordance with an illustrative embodiment;

FIG. 5 is an illustration of a cross-sectional view of a portion of a machining support during a machining operation on a sheet supported by the machining support in accordance with an illustrative embodiment;

FIG. 6 is an illustration of a cross-sectional view of a portion of a machining support during a machining operation on a sheet supported by the machining support in accordance with an illustrative embodiment;

FIGS. 7A and 7B are an illustration of a flowchart of a method for reducing spring back of a sheet following a machining operation on the sheet in accordance with an illustrative embodiment;

DETAILED DESCRIPTION

Figure 1:
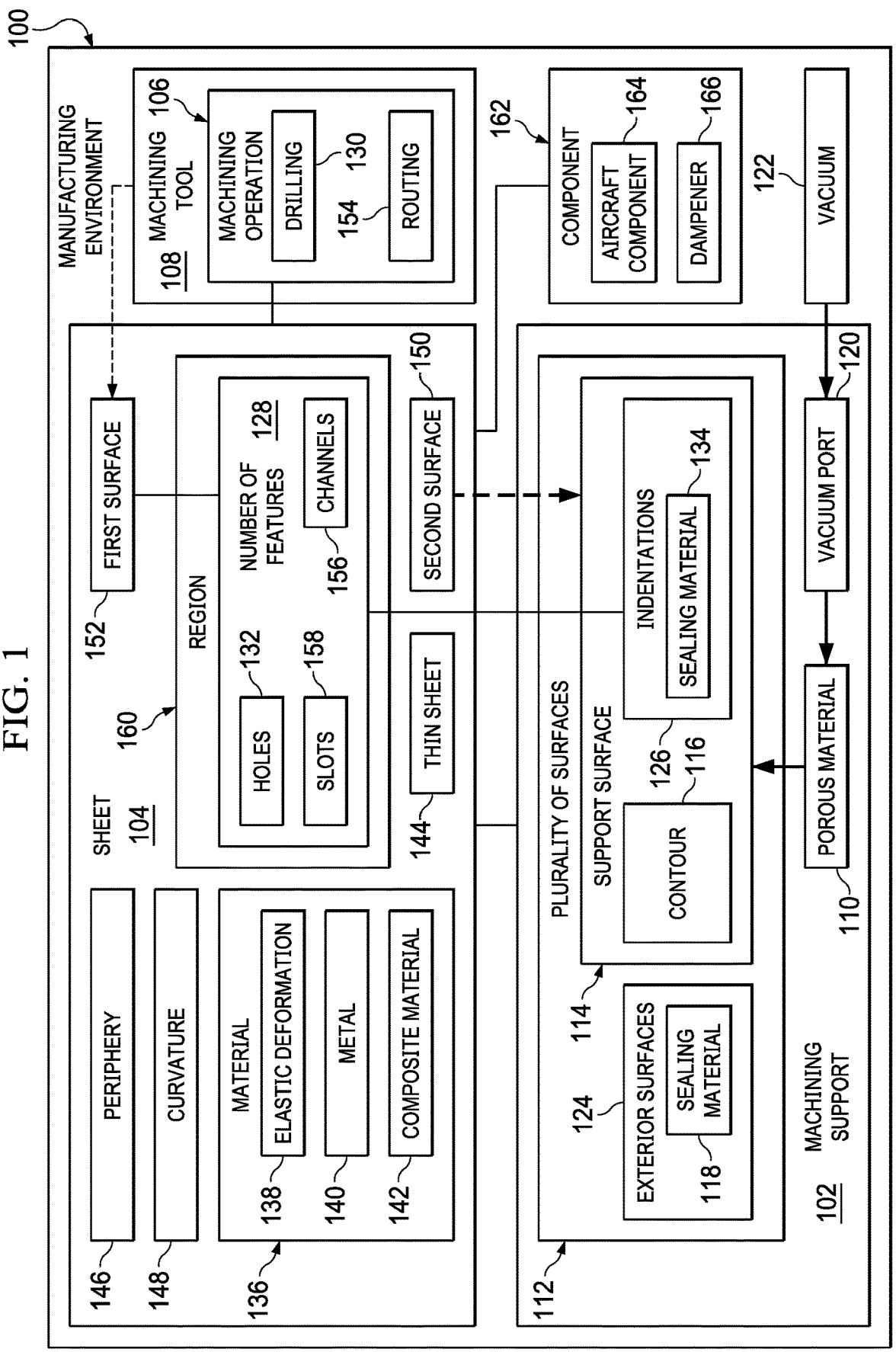
FIG. 1 is an illustration of a block diagram of a machining support configured to reduce spring back following machining operations in a manufacturing environment is utilized in accordance with an illustrative embodiment.

The illustrative embodiments recognize and take into account one or more different considerations. The illustrative embodiments recognize and take into account that prior to machining the sheet, the sheet is restrained against a backing plate style support tool. Often, the sheet is restrained at the periphery, leaving the remainder of the sheet unrestrained such that the restraint does not inhibit processing. While the periphery of sheet is restrained, the remainder of the sheet may bend such that portions of the sheet are not in contact with the support surface of the support tool. The portions of the sheet not in contact with the support surface are unsupported. While the periphery of the sheet is restrained against the support tool, a machining operation is performed on a portion of the sheet. The portion of the sheet to be machined may not be contacting the support tool and may be unsupported.

The illustrative embodiments recognize and take into account that performing machining operations on an unsupported portion of the sheet results in spring back. For example, when using a conventional drill system to drill holes, the drill bit initially makes contact with the unsupported surface of the sheet and applies pressure to the sheet. The pressure, or machining force, applied from the drill bit initially causes the sheet to compress against the support tool prior to penetrating through the sheet. Once the sheet is completely penetrated, the elastic energy causes the sheet to rapidly spring back to its free state. This spring back of the sheet is uncontrolled.

The sheet is pushed by the machining force of the drill bit in the direction of the support tool during the machining operation. After the drill bit passes through the sheet, the sheet is no longer subjected to the pushing machining force of the drill bit, and the sheet springs back to its original location.

For example, the illustrative embodiments recognize and take into account that a support tool desirably complements the shape of the sheet. The illustrative embodiments recognize and take into account that a support tool may not precisely complement the shape of the sheet over the entirety of the support tool. The illustrative embodiments recognize and take into account that the support surface of the support tool may be non-planar to support the sheet. The illustrative embodiments recognize and take into account that restraining a sheet on a support tool may result in a gap between the support surface and the sheet.

The illustrative embodiments recognize and take into account that the support surface of the support tool may be non-planar to support the sheet. The illustrative embodiments recognize and take into account that the support surface of the support tool may be concave to support the sheet. When the support surface is concave, restraining the periphery of sheet causes the remainder of the sheet to bend such that portions of the sheet are not in contact with the support surface of the support tool. The illustrative embodiments recognize and take into account that a combination of the shape of the sheet and the shape of the support tool may cause gaps between the sheet and the support tool. The illustrative embodiments recognize and take into account that a gap may occur even when potential spring back energy is present in the sheet.

The illustrative embodiments also recognize and take into account that to reduce spring back of a sheet of material, contact between the sheet and the support tool may be increased. Spring back of the sheet is the sheet returning to an original shape when force is removed from the sheet. By maintaining contact between the sheet and the tool, spring back of the sheet following the machining operation is reduced or eliminated. By maintaining contact between the sheet and the tool, the sheet substantially maintains its shape before and as a machining force is applied to the sheet. By maintaining contact between the sheet and the tool, spring back of the sheet is constrained until after the machining operations are completed and the sheet is released from the support tool.

The illustrative embodiments recognize and take into account that performing machining operations on an unsupported portion of the sheet may result in undesirable locations for the machining operations. The illustrative embodiments recognize and take into account that it may be desirable for the sheet to contact the support surface for desirable positioning of features created during the machining operations.

The illustrative embodiments also recognize and take into account that to reduce spring back a sheet of material may be tacked to a support tool using a temporary adhesive. However, adhesive residue may transfer to machining tools, such as drill bits. Adhesive residue on machining tools may undesirably affect at least one of the life of the machining tools, or the quality of the manufactured component. For example, adhesive residue may undesirably affect the quality of drilled holes in a manufactured component. The illustrative embodiments recognize and take into account that applying an adhesive adds time and cost to the manufacturing process.

Additionally, an adhesive used to hold a sheet of material to a support tool would be qualified for contact use with the type of material of the sheet as well as the material of the support tool. It would be undesirable to use an adhesive that would damage either the material of the sheet or the material of the support tool. Depending upon the material of the sheet, there may be a limited quantity of qualified adhesives.

In some manufacturing operations, vacuum is applied to a sheet to hold the sheet against a support tool. However, conventional vacuum plates having vacuum channels around the periphery do not apply vacuum to the center of the sheet where machining operations are performed. Machining operations, such as perforating processes, would diminish the effectiveness of conventional vacuum plates with vacuum channels in the region of machining operations.

The illustrative embodiments recognize and take into account that conventional methods of attempting to reduce spring back include methods of holding the sheet against the support tool. Conventional methods of attempting to reduce spring back include methods of increasing the supported surface of the sheet around the periphery of the sheet.

The illustrative embodiments provide machining supports and methods for reducing spring back in machining operations. The illustrative embodiments support the sheet using machining supports formed of porous material. By holding the sheet against a support surface using vacuum, spring back of the sheet following the machining operation is reduced or eliminated.

Turning now to FIG. 1, an illustration of a block diagram of a machining support configured to reduce spring back following machining operations in a manufacturing environment is depicted in accordance with an illustrative embodiment. Manufacturing environment 100 has machining support 102 to support sheet 104 while machining operation 106 is performed by machining tool 108 on sheet 104.

Machining support 102 is configured to reduce spring back of sheet 104 following machining operation 106 is on sheet 104. Machining support 102 comprises porous material 110 with plurality of surfaces 112 including support surface 114 having contour 116 configured to contact and support sheet 104, sealing material 118 covering each of plurality of surfaces 112 except support surface 114, and vacuum port 120 configured to provide vacuum 122 to porous material 110.

Sealing material 118 on exterior surfaces 124 prevents vacuum 122 from escaping through exterior surfaces 124. Vacuum 122 will escape through support surface 114 to hold sheet 104 against support surface 114.

In some illustrative examples, indentations 126 are present in support surface 114. In these illustrative examples, indentations 126 correspond to locations of machining operations on sheet 104. In these illustrative examples, indentations 126 correspond to locations of number of features 128 of sheet 104. As used herein, a "number of" items is one or more items. Thus, number of features 128 is one or more features. In these illustrative examples, an indentation corresponds to a feature when machining tool 108 could extend through the feature and into the indentation.

In some illustrative examples, indentations 126 are formed by performing machining operation 106 on sheet 104. For example, when machining operation 106 is drilling 130 holes 132 in sheet 104, indentations 126 are formed by drilling 130 extending through sheet 104 and impacting porous material 110.

In some other illustrative examples, each of indentations 126 is larger than a corresponding feature of number of features 128 to be machined into sheet 104. When each of indentations 126 is larger than the corresponding feature to be machined into sheet 104, machining operation 106 will not remove material from support surface 114. When each of indentations 126 is larger than the corresponding feature to be machined into sheet 104, machining tolerances are taken into account.

After indentations 126 are formed in support surface 114, sealing material 134 is placed within each of indentations 126. In some illustrative examples, indentations 126 are formed and filled with sealing material 134 prior to placing sheet 104 on support surface 114. In some illustrative examples, indentations 126 are formed when sheet 104 is on support surface 114 and indentations 126 are sealed with sealing material 134 after sheet 104 is removed from machining support 102.

Porous material 110 takes any desirable form. In some illustrative examples, porous material 110 is an open cell foam. In some illustrative examples, porous material 110 is a manufactured wood. Porous material 110 is selected to allow vacuum 122 to travel throughout machining support 102 and escape through support surface 114. The physical characteristics of porous material 110, including the porosity, act as a distribution system for vacuum 122 throughout porous material 110. Machining support 102 is formed of porous material 110 and the porosity of porous material 110 acts as a distribution system for vacuum 122 throughout machining support 102.

Sheet 104 is supported by support surface 114 while machining operation 106 is performed on sheet 104. Machining operation 106 is used to form number of features 128 in sheet 104. Sheet 104 is formed of material 136. In some illustrative examples, material 136 takes the form of any desirable material that has elastic deformation 138. Elastic deformation 138 is the ability of material 136 to temporarily change shape when a force is applied. When the force is removed, elastic deformation 138 allows material 136 to return to its original shape. In some illustrative examples, material 136 is one of metal 140 or composite material 142. When material 136 is composite material 142, composite material 142 is cured or partially cured.

In some illustrative examples, sheet 104 is referred to as thin sheet 144. Sheet 104 may be referred to as thin sheet 144, as sheet 104 is thin enough to deflect when pressure from machining operation 106 is applied to sheet 104 without machining support 102 having support surface 114. In some illustrative examples when sheet 104 is a composite material 142 such as a CFRP laminate, the thickness of material 136 is between 0.020" and 0.100". In addition to the thickness of sheet 104, a quantity of plies and orientation of fibers in composite material 142 affect the deflection of sheet 104. Composite materials having the same thickness but different layups may deflect to a different degree.

Sheet 104 is held against support surface 114 when vacuum 122 is provided to porous material 110 of machining support 102. Contour 116 of support surface 114 is configured to support curvature 148. Support surface 114 is configured to support all of second surface 150, not just periphery 146.

Machining operation 106 is performed on sheet 104 to form number of features 128 while sheet 104 is held against support surface 114. Machining operation 106 is performed through first surface 152 of sheet 104. First surface 152 is opposite second surface 150. In some illustrative examples, first surface 152 is referred to as a front surface of sheet 104 and second surface 150 is referred to as a back surface of sheet 104.

Machining operation 106 is any desirable operation. In some illustrative examples, machining operation 106 is drilling 130. In some illustrative examples, machining operation 106 is routing 154. Machining operation 106 forms number of features 128.

Number of features 128 may take any desirable form. Number of features 128 includes holes 132 or other shapes, such as channels 156 or slots 158. In some illustrative examples, number of features 128 are each in the 0.020" to 0.300" size range. In some illustrative examples, number of features 128 is arranged in a repeating pattern to achieve a consistent percent open area. Open area is a ratio of the amount of first surface 152 taken up by number of features 128. In some illustrative examples, the pattern of number of features 128 has a percent open area in the range of five percent open area to 30 percent open area based on design criteria of component 162.

Number of features 128 is formed in region 160. In some illustrative examples, if sheet 104 were restrained only by periphery 146, performing machining operation 106 in region 160 would result in spring back. By supporting more of second surface 150 than just periphery 146, spring back of sheet 104 is reduced or eliminated following machining operation 106 in region 160.

Machining tool 108 performs machining operation 106 on sheet 104 to form component 162. Component 162 is a component of any desirable type of platform. The platform may be, for example, a vehicle, a mobile platform, a stationary platform, a land-based structure, an aquatic-based structure, or a space-based structure. More specifically, a platform may be a surface ship, a tank, a personnel carrier, a train, a spacecraft, a space station, a satellite, a submarine, an automobile, a power plant, a bridge, a dam, a house, a manufacturing facility, a building, or other suitable platforms. In some illustrative examples, the platform takes the form of an aircraft. In these illustrative examples, component 162 is aircraft component 164.

Component 162 has at least one feature formed by machining tool 108 in machining operation 106. For example, component 162 may have a plurality of slots, a plurality of channels, a plurality of holes, or any other desired feature. In some illustrative examples, component 162 is a perforated component. In some illustrative examples, component 162 takes the form of dampener 166. Dampener 166 may be an acoustic dampener, a pressure dampener, or any other type of dampener.

The illustration of manufacturing environment 100 and machining support 102 in FIG. 1 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, although component 162 is described as a dampener 166, component 162 may take any desirable form. In some illustrative examples, component 162 is an aesthetic panel for decorating an interior or an exterior of a platform.

Turning now to FIG. 2, an illustration of a cross-sectional view of a sheet on a machining support configured to reduce spring back following machining operations is depicted in accordance with an illustrative embodiment. In view 200, sheet 202 is held against machining support 204. Machining support 204 is configured to reduce spring back of sheet 202 following a machining operation on sheet 202. Machining support 204 is an implementation of machining support 102 of FIG. 1. Machining support 204 comprises porous material 206 with plurality of surfaces 208. Plurality of surfaces 208 includes support surface 210 having contour 212 configured to contact and support sheet 202. Sealing material 214 covers each of plurality of surfaces 208 except support surface 210. Vacuum port 216 is configured to provide a vacuum to porous material 206.

Sealing material 214 prevents a vacuum from escaping through plurality of surfaces 208 other than support surface 210. For example, sealing material 214 on exterior surface 218 prevents vacuum from escaping exterior surface 218. As another example, sealing material 214 on exterior surface 220 prevents vacuum from escaping exterior surface 220. Vacuum port 216 extends through sealing material 214 of exterior surface 222.

Porous material 206 takes any desirable form to transport vacuum throughout machining support 204. In some illustrative examples, porous material 206 is an open cell foam. In another illustrative example, porous material 206 is a manufactured wood.

Vacuum supplied through vacuum port 216 and distributed by through porous material 206 holds sheet 202 against support surface 210. More specifically, second surface 224 of sheet 202 is held against support surface 210. While second surface 224 of sheet 202 is held against support surface 210, a machining operation can be performed through first surface 226.

When sheet 202 is held against support surface 210, sheet 202 and machining support 204 form a vacuum chamber. As depicted, porous material 206 does not have any indentations. If machining operations extend through sheet 202, indentations will be formed into porous material 206. If indentations are formed into porous material 206 during machining operations, vacuum will escape through the indentations.

The illustration of machining support 204 in FIG. 2 is not meant to imply physical or architectural limitations to the manner in which an illustrative embodiment may be implemented. Other components in addition to or in place of the ones illustrated may be used.

For example, contour 212 of support surface 210 may have any desirable shape to support sheet 202. In some illustrative examples, sheet 202 has a different curvature than the curvature depicted in FIG. 2. In these illustrative examples, support surface 210 has a different contour than contour 212 depicted in FIG. 2 so that support surface 210 mirrors the curvature of sheet 202. Contour 212 of support surface 210 is configured to support and contact sheet 202 so that sheet 202 contacts support surface 210 in areas in which manufacturing operations will be performed. As another illustrative example, vacuum port 216 may be located in a different location than exterior surface 222. For example, vacuum port 216 may be in exterior surface 218. As another illustrative example, vacuum port 216 may be located in a different location within exterior surface 222. As another illustrative example, vacuum port 216 may be in exterior surface 220.

Turning now to FIG. 3, an illustration of a cross-sectional view of a sheet on a machining support after machining operations were performed on the sheet is depicted in accordance with an illustrative embodiment. View 300 is a view of sheet 202 after a machining operation is performed. In view 300, sheet 202 has number of features 302. Number of features 302 may be a plurality of holes, or a plurality of slots. In some illustrative examples, sheet 202 may be referred to as a perforated sheet.

As depicted, performing a machining operation on sheet 202 has produced indentations 304 in machining support 204. As depicted, indentations 304 in support surface 210 correspond to locations of machining operations on sheet 202. As depicted, indentations 304 in support surface 210 correspond to locations of number of features 302.

The illustration of features 302 and indentations 304 in FIG. 3 is not meant to imply physical or architectural limitations to the manner in which an illustrative embodiment may be implemented. For example, the quantity, size, and locations of features 302 in sheet 202 are not meant to imply physical or architectural limitations. Features 302 may have any desirable quantity, size, locations, and type of feature.

Figure 4:
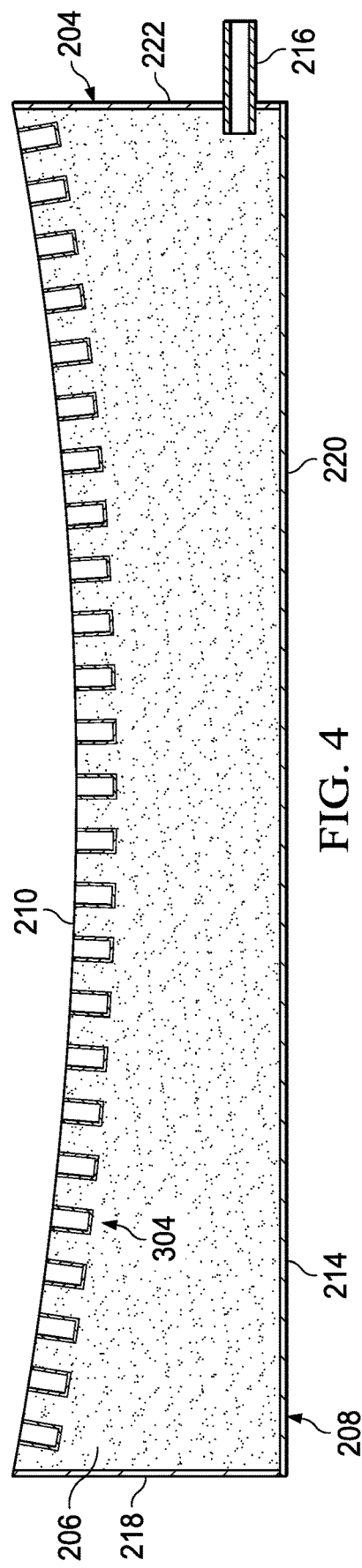
FIG. 4 is an illustration of a cross-sectional view of a machining support with features in the support surface in accordance with an illustrative embodiment.

Turning now to FIG. 4, an illustration of a cross-sectional view of a machining support with features in the support surface is depicted in accordance with an illustrative embodiment. Machining support 400 is a physical implementation of machining support 102 of FIG. 1. Machining support 400 may be the same as machining support 204 with indentations 304.

Machining support 400 is configured to reduce spring back of a sheet following a machining operation on the sheet. Machining support 400 comprises porous material 402 with plurality of surfaces 404. Plurality of surfaces 404 includes support surface 406 having contour 408 configured to contact and support a sheet. Sealing material 410 covers each of plurality of surfaces 404 except support surface 406. Vacuum port 412 is configured to provide a vacuum to porous material 402.

Sealing material 410 prevents a vacuum from escaping through plurality of surfaces 404 other than support surface 406. For example, sealing material 410 on exterior surface 414 prevents vacuum from escaping exterior surface 414. As another example, sealing material 410 on exterior surface 416 prevents vacuum from escaping exterior surface 416. Vacuum port 412 extends through sealing material 410 of exterior surface 418.

Porous material 402 takes any desirable form to transport vacuum throughout machining support 400. In some illustrative examples, porous material 402 is an open cell foam. In another illustrative example, porous material 402 is a manufactured wood.

Vacuum supplied through vacuum port 412 and extending through porous material 402 will hold a sheet against support surface 406. Machining support 400 comprises indentations 420 in support surface 406, indentations 420 corresponding to locations of machining operations on the sheet.

In some illustrative examples, each of indentations 420 is larger than a corresponding feature to be machined into the sheet. In this illustrative example, sealing material 422 is within each of indentations 420.

When a sheet is held against support surface 406, the sheet and machining support 400 form a vacuum chamber. As indentations 420 are sealed with sealing material 422, the vacuum chamber remains throughout machining operations for corresponding features machining into the sheet.

Turning now to FIG. 5, an illustration of a cross-sectional view of a portion of a machining support during a machining operation on a sheet supported by the machining support is depicted in accordance with an illustrative embodiment. Machining support 500 is a physical implementation of machining support 102 of FIG. 1. In some illustrative examples, view 502 is a view of machining operation being performed on a portion of sheet 202 between FIGS. 2 and 3.

Machining support 500 has support surface 504. Sheet 506 is held against support surface 504 of machining support 500 by vacuum 507 applied to porous material 508 of machining support 500. In view 502, feature 510 has been machined into sheet 506. Indentation 512 was formed by machining operation that created feature 510 of sheet 506.

As can be seen in view 502, vacuum 507 escapes through indentation 512. The vacuum provided is adjusted so that vacuum 507 in porous material 508 is maintained. In some illustrative examples, the vacuum provided to porous material 508 is adjusted to maintain a pressure differential across second surface 513 of sheet 506 to hold second surface 513 against support surface 504 of porous material 508 while the machining operation is performed on sheet 506.

In view 502, machining tool 514 is performing a machining operation on sheet 506. As depicted, machining tool 514 is extending through sheet 506 and forming indentation 516 into support surface 504. As depicted, machining tool 514 takes the form of a drill bit. Although not depicted, machining tool 514 may be attached to any desirable machine, such as a drill, a CNC machine, or any other desirable machine.

Turning now to FIG. 6, an illustration of a cross-sectional view of a portion of a machining support during a machining operation on a sheet supported by the machining support is depicted in accordance with an illustrative embodiment. Machining support 600 is a physical implementation of machining support 102 of FIG. 1.

In view 602, machining support 600 has support surface 604. Sheet 606 is held against support surface 604 of machining support 600 by vacuum 607 applied to porous material 608 of machining support 600. In view 602, feature 610 has been machined into sheet 606. Indentation 612 and indentation 614 were formed into porous material 608 prior to holding sheet 606 against support surface 604. In some illustrative examples, indentation 612 and indentation 614 were formed into porous material 608 while performing machining operations on a different sheet (not depicted). In other illustrative examples, indentation 612 and indentation 614 were formed into porous material 608 while machining support 600 was manufactured.

Indentation 612 and indentation 614 are both sealed with sealing material 616. Sealing material 616 substantially restricts or prevents vacuum from escaping indentation 612 and indentation 614.

In view 602, machining tool 618 is performing a machining operation on sheet 606. As depicted, machining tool 618 is extending through sheet 606 but does not contact support surface 604. As depicted, machining tool 618 does not contact porous material 608 of machining support 600. Indentation 612 and indentation 614 are larger than feature 610. By indentation 612 and indentation 614 being larger than feature 610 and machining tool 618, machining tool 618 does not contact porous material 608 while performing machining operations to form feature 610. In some illustrative examples, indentation 612 and indentation 614 are sized to take into account tolerances in the machining operations performed by machining tool 618.

Figure 7B:
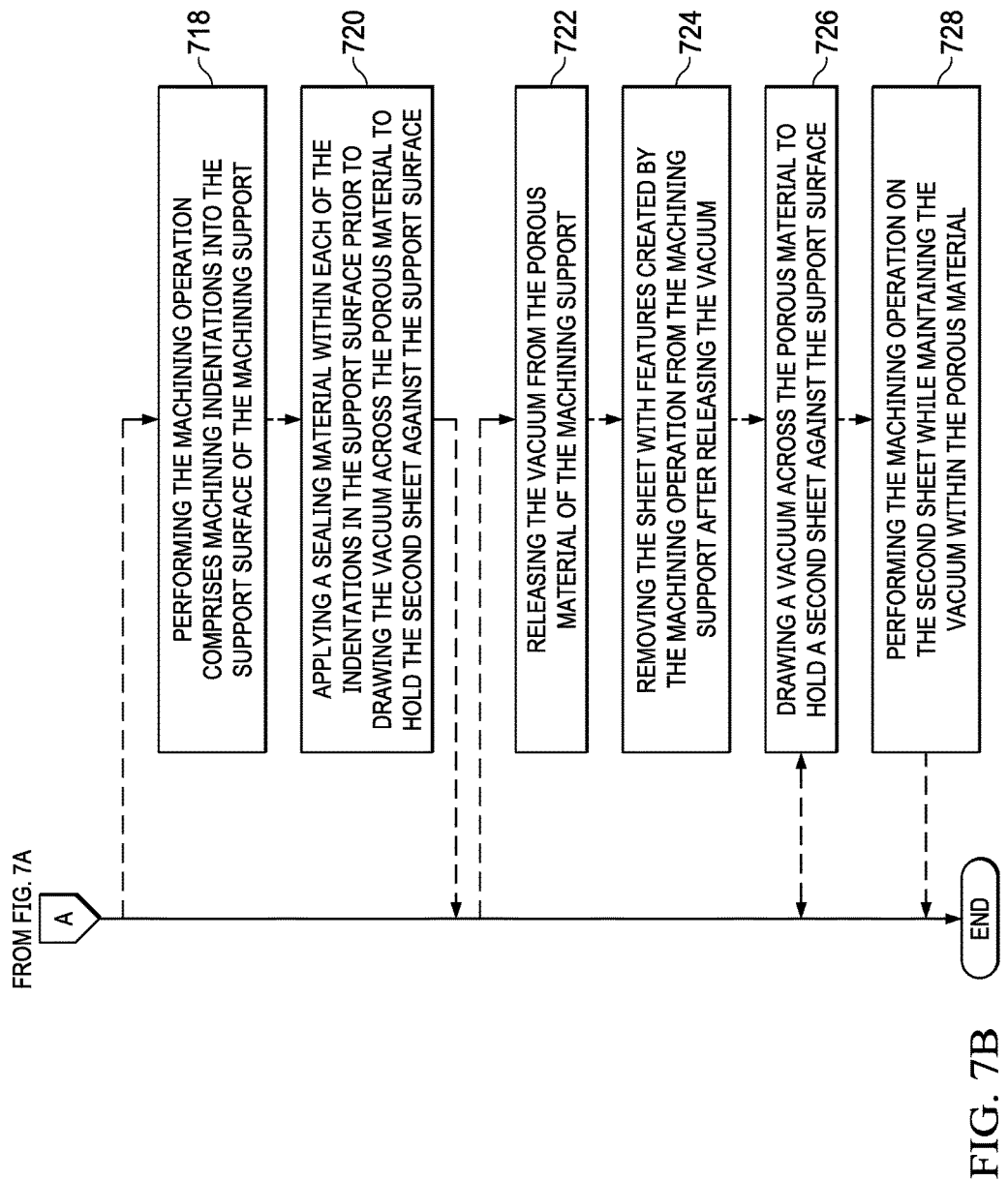

Turning now to FIGS. 7A and 7B, an illustration of a flowchart of a method for reducing spring back of a sheet following a machining operation on the sheet is depicted in accordance with an illustrative embodiment. Method 700 may be implemented using machining support 102 in manufacturing environment 100 of FIG. 1. Method 700 may be implemented using machining support 204 of FIG. 2. Method 700 may be implemented to perform a machining operation on sheet 202 of FIGS. 2 and 3. Method 700 may be implemented using machining support 400 of FIG. 4. Method 700 may be implemented in FIG. 5 using machining support 500. Method 700 may be implemented in FIG. 6 using machining support 600.

Method 700 places a second surface of the sheet in contact with a support surface of a machining support, the machining support comprising a porous material sealed on each surface of the machining support except the support surface (operation 702). In some illustrative examples, when the second surface of the sheet is placed in contact with the support surface, only a portion of second surface of sheet is placed in contact with the support surface of the machining support. In some illustrative examples, when the sheet has a curvature, either the periphery or the center of the sheet is not in contact with the support surface.

Method 700 draws a vacuum across the porous material to hold the second surface against the support surface (operation 704). The vacuum can be drawn across the porous material because of the seals on the remaining surfaces of the machining support. The vacuum extends through the support surface and holds the second surface against the support surface.

Method 700 performs the machining operation through a first surface of the sheet opposite the second surface (operation 706). The machining operation is any desirable operation. The machining operation may be drilling, milling, or any other desirable type of operation.

Method 700 maintains the vacuum within the porous material while performing the machining operation (operation 708). By maintaining the vacuum within the porous material while performing the machining operation, machining force from the machining operation does not deflect the sheet. When the machining operation is performed on the sheet, the sheet is in contact with the support surface and does not deflect. Spring back of the sheet is the sheet returning to an original shape when force is removed from the sheet. By maintaining contact between the second surface of the sheet and the support surface, spring back of the sheet following the machining operation is reduced or eliminated. By maintaining contact between the second surface of the sheet and the support surface, the sheet substantially maintains its shape before and as a machining force is applied to the sheet. Afterwards, method 700 terminates.

In some illustrative examples, indentations are made in the machining support as the machining operation is performed on the sheet. In some illustrative examples, the vacuum is maintained by adjusting the vacuum provided as indentations are made in the machining support.

In some illustrative examples, performing the machining operation through the first surface comprises drilling holes through the sheet (operation 710). In some illustrative examples, performing the machining operation further comprises machining indentations into the support surface of the machining support as the machining operation is performed through the first surface of the sheet (operation 712).

In some illustrative examples, method 700 applies a sealing material within each of the indentations in the support surface (operation 714). In some illustrative examples, the sealing material is placed into each of the indentations in one sealing process after each of the indentations has been formed. In this illustrative example, the sealing material is applied after the sheet is removed from the support surface. When the sealing material is applied within each of the indentations, vacuum is not lost from the indentations. When the sealing material is applied within each of the indentations, the machining support can be used to support another sheet.

In some illustrative examples, method 700 adjusts the vacuum provided to the porous material to maintain a pressure differential across the second surface of the sheet to hold the second surface against the support surface of the porous material while the machining operation is performed on the sheet (operation 716).

In some illustrative examples, performing the machining operation comprises machining indentations into the support surface of the machining support (operation 718) as the holes are drilled into the sheet, and method 700 applies a sealing material within each of the indentations in the support surface prior to drawing the vacuum across the porous material to hold the second sheet against the support surface (operation 720). In some illustrative examples, the sealing material is placed into each of the indentations in one sealing process after each of the indentations has been formed. In this illustrative example, the sealing material is applied after the sheet is removed from the support surface. When the sealing material is applied within each of the indentations, vacuum is not lost from the indentations. When the sealing material is applied within each of the indentations, the machining support can be used to support other sheets, including second sheet.

In some illustrative examples, method 700 releases the vacuum from the porous material of the machining support (operation 722). In some illustrative examples, method 700 removes the sheet with features created by the machining operation from the machining support after releasing the vacuum (operation 724). In some illustrative examples, method 700 draws a vacuum across the porous material to hold a second sheet against the support surface (operation 726). In some illustrative examples, method 700 performs the machining operation on the second sheet while maintaining the vacuum within the porous material (operation 728).

Figure 8:
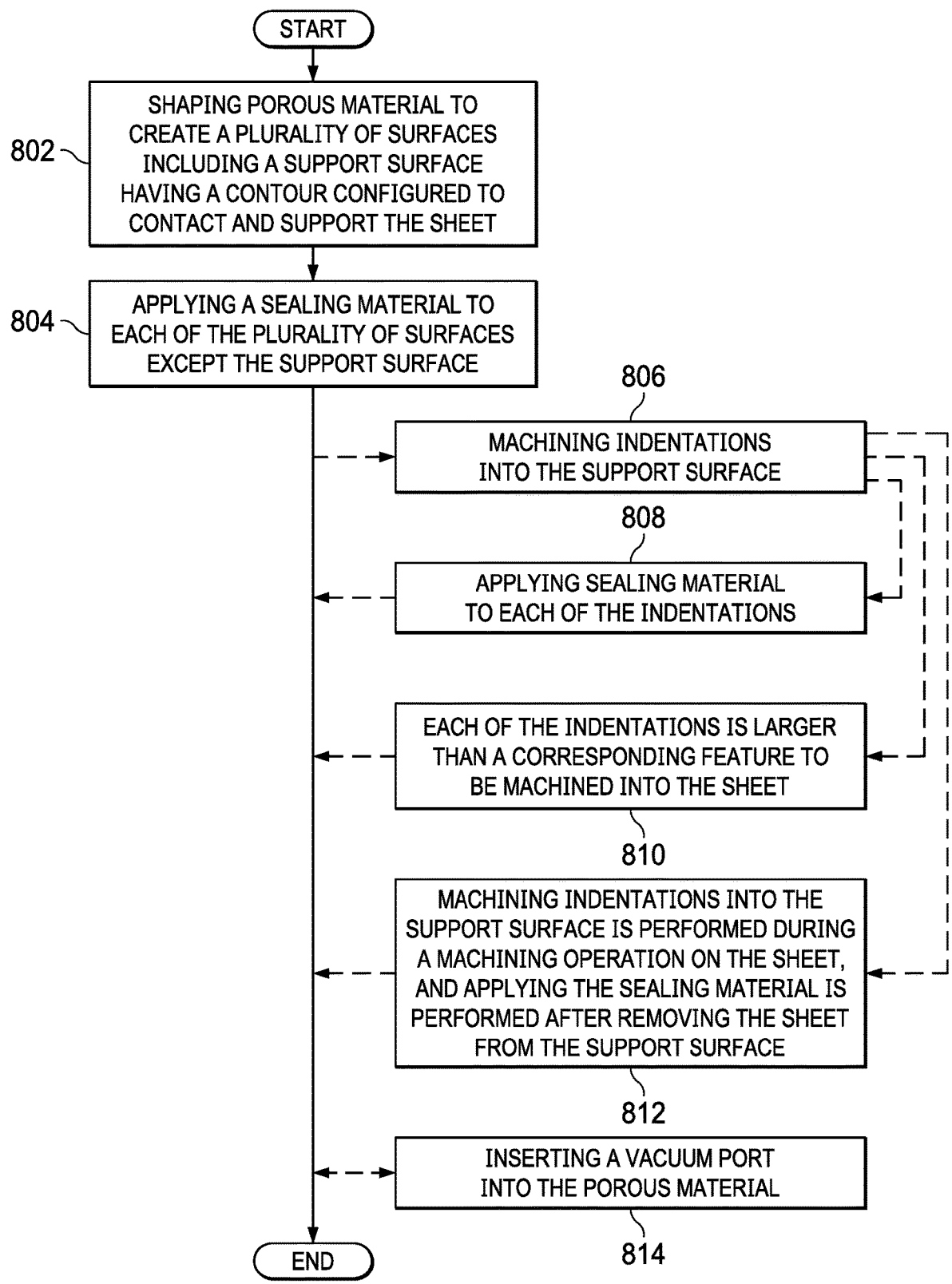
FIG. 8 is an illustration of a flowchart of a method for forming a machining support configured to reduce spring back of a sheet following a machining operation on the sheet in accordance with an illustrative embodiment.

Turning now to FIG. 8 is an illustration of a flowchart of a method for forming a machining support configured to reduce spring back of a sheet following a machining operation on the sheet in accordance with an illustrative embodiment. Method 800 may be implemented to form machining support 102 in FIG. 1. Method 800 may be implemented to form machining support 204 of FIGS. 2 and 3. Method 800 may be implemented to form machining support 400 of FIG. 4. Method 800 may be implemented to form machining support 500 of FIG. 5. Method 800 may be implemented to form machining support 600 in FIG. 6.

Method 800 shapes porous material to create a plurality of surfaces including a support surface having a contour configured to contact and support the sheet (operation 802). Method 800 applies a sealing material to each of the plurality of surfaces except the support surface (operation 804). By sealing the plurality of surfaces, an applied vacuum will not escape through the sealed surfaces of the machining support. By not sealing support surface, a vacuum applied to the porous material will escape through the support surface to hold a sheet against the support surface. Afterwards, method 800 terminates.

In some illustrative examples, method 800 machines indentations into the support surface (operation 806). In some illustrative examples, the indentations are machined into the support surface prior to placing a sheet onto the support surface.

In some illustrative examples, method 800 applies sealing material to each of the indentations (operation 808). Sealing material within each of the indentations prevents a vacuum from escaping through the indentations. Sealing material within each of the indentations only allows vacuum to escape through the support surface of the machining support.

In some illustrative examples, each of the indentations is larger than a corresponding feature to be machined into the sheet (operation 810). When each of the indentations is larger than the corresponding feature to be machined into the sheet, the machining operation will not remove material from the support surface. When each of the indentations is larger than the corresponding feature to be machined into the sheet, machining tolerances are taken into account.

In some illustrative examples, machining indentations into the support surface is performed during a machining operation on the sheet, and applying the sealing material is performed after removing the sheet from the support surface (operation 812).

In some illustrative examples, method 800 inserts a vacuum port into the porous material (operation 814). The vacuum port provides an inlet through one of the sealed surfaces to draw a vacuum on the porous material.

Figure 9:
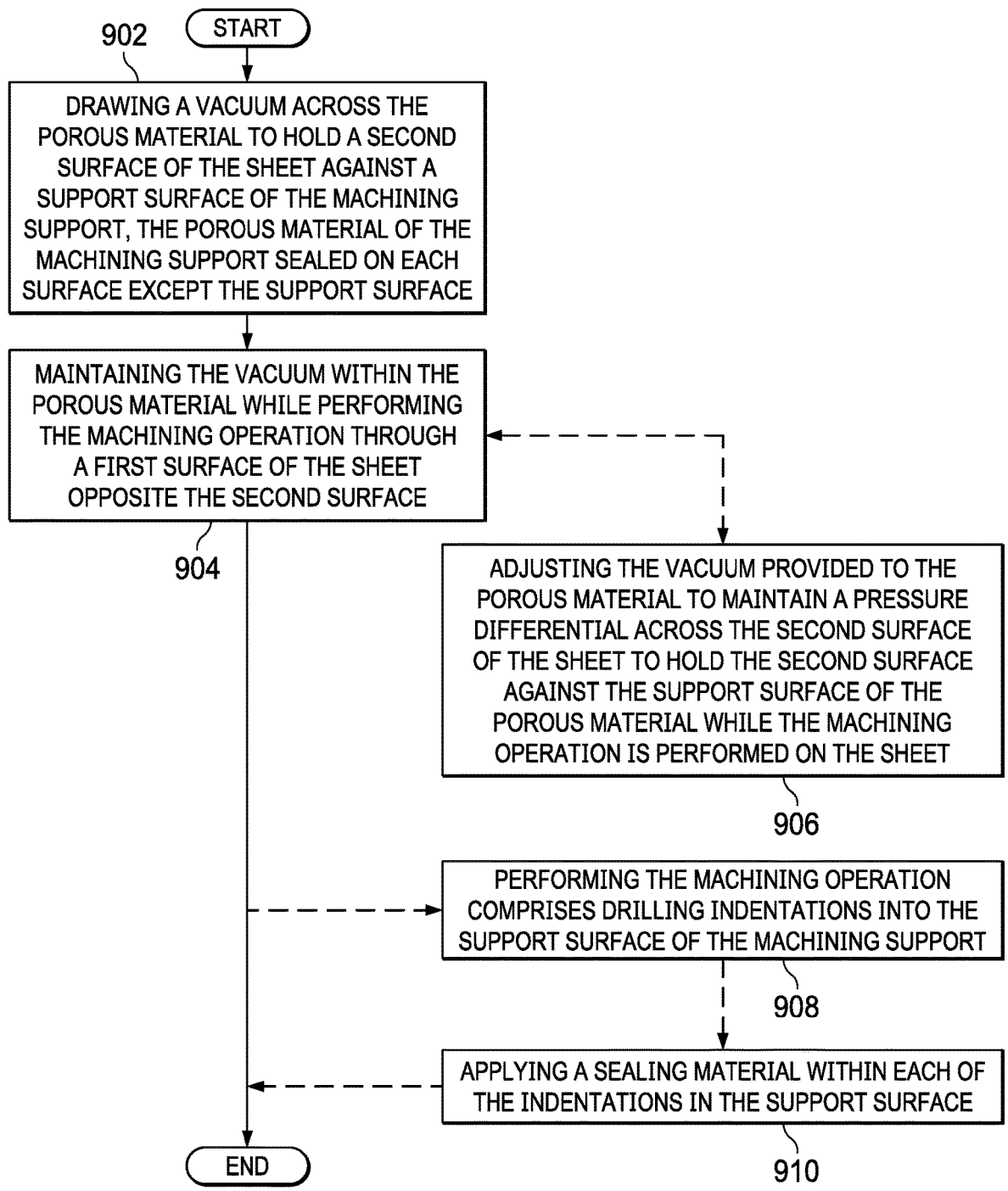
FIG. 9 is an illustration of a flowchart of a method for reducing spring back of a sheet following a machining operation on the sheet in accordance with an illustrative embodiment.

Turning now to FIG. 9, an illustration of a flowchart of a method for reducing spring back of a sheet following a machining operation on the sheet is depicted in accordance with an illustrative embodiment. Method 900 may be implemented using machining support 102 in manufacturing environment 100 of FIG. 1. Method 900 may be implemented using machining support 204 of FIG. 2. Method 900 may be implemented to perform a machining operation on sheet 202 of FIGS. 2 and 3. Method 900 may be implemented using machining support 400 of FIG. 4. Method 900 may be implemented in FIG. 5 using machining support 500. Method 900 may be implemented in FIG. 6 using machining support 600.

Method 900 draws a vacuum across a porous material of a machining support to hold a second surface of the sheet against a support surface of the machining support, the porous material of the machining support sealed on each surface except the support surface (operation 902). Method 900 maintains the vacuum within the porous material while performing the machining operation through a first surface of the sheet opposite the second surface (operation 904). Afterwards, method 900 terminates.

In some illustrative examples, method 900 adjusts the vacuum provided to the porous material to maintain a pressure differential across the second surface of the sheet to hold the second surface against the support surface of the porous material while the machining operation is performed on the sheet (operation 906). In some illustrative examples, performing the machining operation further comprises machining indentations into the support surface of the machining support as the machining operation is performed through the first surface of the sheet (operation 908). In some illustrative examples, method 900 applies a sealing material within each of the indentations in the support surface (operation 910).

As used herein, the phrase "at least one of," when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, "at least one of item A, item B, or item C" may include, without limitation, item A, item A and item B, or item B. This example also may include item A, item B, and item C, or item B and item C. Of course, any combination of these items may be present. In other examples, "at least one of" may be, for example, without limitation, two of item A, one of item B, and ten of item C; four of item B and seven of item C; or other suitable combinations.

The flowcharts and block diagrams in the different depicted embodiments illustrate the architecture, functionality, and operation of some possible implementations of apparatus and methods in an illustrative embodiment. In this regard, each block in the flowcharts or block diagrams may represent a module, a segment, a function, and/or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added, in addition to the illustrated blocks, in a flowchart or block diagram. Some blocks may be optional. For example, in method 700, operations 710 through 728 may be optional. As another example, in method 800, operations 806 through 814 may be optional. As another example, in method 900, operations 906 through 910.

Figure 10:
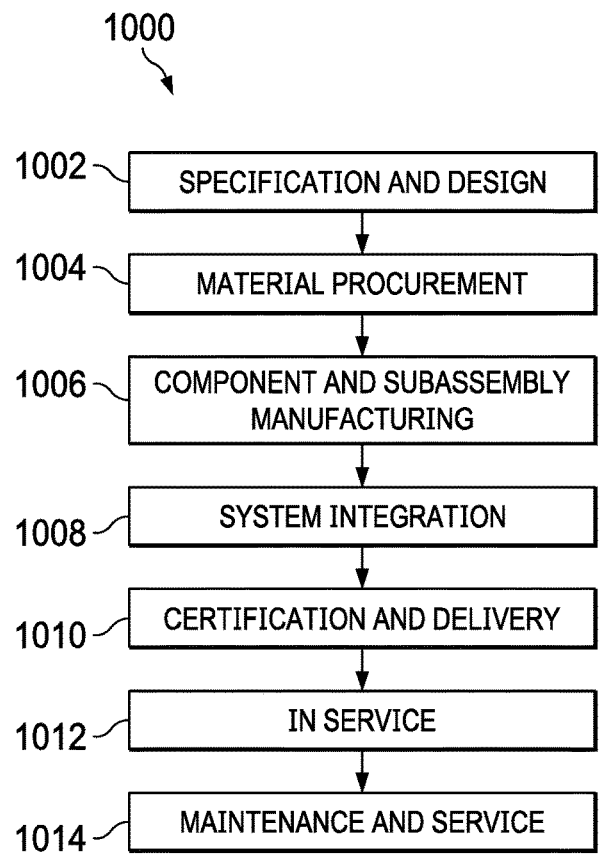
FIG. 10 is an illustration of an aircraft manufacturing and service method in a form of a block diagram in accordance with an illustrative embodiment.
Figure 11:
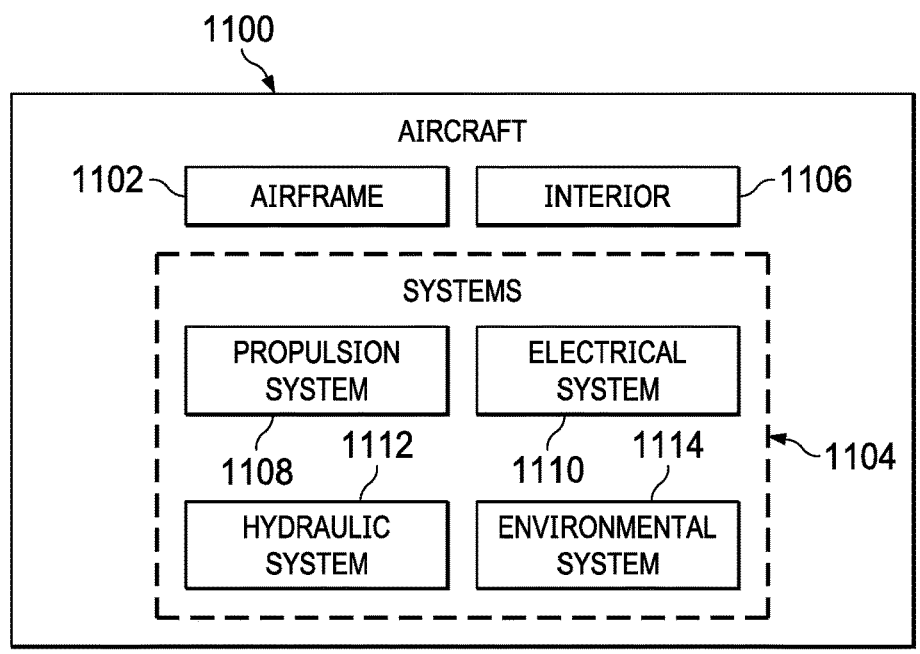
FIG. 11 is an illustration of an aircraft in a form of a block diagram in which an illustrative embodiment may be implemented.

Illustrative embodiments of the present disclosure may be described in the context of aircraft manufacturing and service method 1000 as shown in FIG. 10 and aircraft 1100 as shown in FIG. 11. Turning first to FIG. 10, an illustration of an aircraft manufacturing and service method is depicted in accordance with an illustrative embodiment. During pre-production, aircraft manufacturing and service method 1000 may include specification and design 1002 of aircraft 1100 in FIG. 11 and material procurement 1004.

During production, component and subassembly manufacturing 1006 and system integration 1008 of aircraft 1100 takes place. Thereafter, aircraft 1100 may go through certification and delivery 1010 in order to be placed in service 1012. While in service 1012 by a customer, aircraft 1100 is scheduled for routine maintenance and service 1014, which may include modification, reconfiguration, refurbishment, or other maintenance and service.

Each of the processes of aircraft manufacturing and service method 1000 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 11, an illustration of an aircraft is depicted in which an illustrative embodiment may be implemented. In this example, aircraft 1100 is produced by aircraft manufacturing and service method 1000 of FIG. 10 and may include airframe 1102 with plurality of systems 1104 and interior 1106. Examples of systems 1104 include one or more of propulsion system 1108, electrical system 1110, hydraulic system 1112, and environmental system 1114. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 1000. One or more illustrative embodiments may be used during at least one of component and subassembly manufacturing 1006, system integration 1008, or maintenance and service 1014 of FIG. 10. For example, machining support 102 may be used during component and subassembly manufacturing 1006 to form a component of aircraft 1100. As another illustrative example, machining support 102 may be used and service 1014. Machining support 102 may be used to manufacture portions of aircraft 1100 such as airframe 1102 or portions of interior 1106.

The illustrative examples provide a method and machining support for holding a thin sheet, such as a thin CFRP laminate, during a machining operation. Holding the sheet against the machining support keeps the sheet stable during a machining operation, such as a robotic perforation process for acoustic treatment. In the illustrative examples, a vacuum source pulls a vacuum through a porous media, or material, shaped to the curvature of the sheet to hold the sheet against the support surface of the machining support. The porous media provides some local flow resistance such that total vacuum over the sheet is not lost when multiple holes, or other features, are perforated in the laminate.

By holding the sheet to the machining support with a vacuum, an even, intimate contact can be created over the whole of the sheet to stabilize it. By providing stabilization to the sheet, holes or other features with acceptable quality are created in the sheet.

By maintaining the vacuum within the porous material while performing the machining operation, intimate contact is maintained between the sheet and the support surface. By maintaining contact between the sheet and the support surface, the machining force from the machining operation does not deflect the sheet. When the machining operation is performed on the sheet, the sheet is in contact with the support surface and does not deflect. Spring back of the sheet is the sheet returning to an original shape when force is removed from the sheet. By maintaining contact between the second surface of the sheet and the support surface, spring back of the sheet following the machining operation is reduced or eliminated. By maintaining contact between the second surface of the sheet and the support surface, spring back of the sheet is controlled. By maintaining contact between the second surface of the sheet and the support surface, spring back of the sheet occurs after release of the sheet from the support tool.

The sheet may be perforated for any desirable purpose. In some illustrative examples, a sheet may be perforated for acoustic treatment. By using a porous material to restrict airflow over the entire support surface, the surface of the sheet can be perforated without completely losing vacuum as would happen in a conventional vacuum hold down system relying on gasketed vacuum zones.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method of reducing spring back of a first sheet following a machining operation on the first sheet, the method comprising:
    drawing a vacuum across a porous material of a machining support to hold a second surface of the first sheet against a support surface of the machining support, the porous material of the machining support sealed on each surface except the support surface;
    maintaining the vacuum within the porous material while performing the machining operation through a first surface of the first sheet opposite the second surface;
    releasing the vacuum from the porous material of the machining support;
    removing the first sheet with features created by the machining operation from the machining support after releasing the vacuum;
    drawing a vacuum across the porous material to hold a second sheet against the support surface; and
    performing the machining operation on the second sheet while maintaining the vacuum within the porous material,
    wherein performing the machining operation comprises machining indentations into the support surface of the machining support as features are created into the first sheet, and the method further comprising:
    applying a sealing material within each of the indentations in the support surface prior to drawing the vacuum across the porous material to hold the second sheet against the support surface.

2. The method of claim 1, further comprising:
    adjusting the vacuum provided to the porous material to maintain a pressure differential across the second surface of the first sheet to hold the second surface against the support surface of the porous material while the machining operation is performed on the first sheet.

3. The method of claim 1, further comprising inserting a vacuum port into the porous material.

4. The method of claim 1, wherein the machining support comprises a backing plate.

5. The method of claim 1, wherein the first sheet comprises a contoured sheet.

6. The method of claim 1, wherein the first sheet comprises a panel.

7. The method of claim 6, wherein the panel comprises an aesthetic panel.

8. The method of claim 1, wherein performing the machining operation through the first surface comprises drilling holes through the first sheet.

9. The method of claim 1, wherein performing the machining operation through the first surface comprises milling through the first sheet.

10. The method of claim 1, wherein performing the machining operation through the first surface comprises routing through the first sheet.

11. A method of reducing spring back of a first sheet following a machining operation on the first sheet, the method comprising:
    placing a second surface of the first sheet in contact with a support surface of a machining support, the machining support comprising a porous material sealed on each surface of the machining support except the support surface;
    drawing a vacuum across the porous material to hold the second surface against the support surface;
    performing the machining operation through a first surface of the first sheet opposite the second surface;
    maintaining the vacuum within the porous material while performing the machining operation;
    releasing the vacuum from the porous material of the machining support;
    removing the first sheet with features created by the machining operation from the machining support after releasing the vacuum;
    drawing a vacuum across the porous material to hold a second sheet against the support surface; and
    performing the machining operation on the second sheet while maintaining the vacuum within the porous material,
    wherein performing the machining operation comprises machining indentations into the support surface of the machining support as features are created into the first sheet, and the method further comprising:
    applying a sealing material within each of the indentations in the support surface prior to drawing the vacuum across the porous material to hold the second sheet against the support surface.

12. The method of claim 11, further comprising:
    adjusting the vacuum provided to the porous material to maintain a pressure differential across the second surface of the first sheet to hold the second surface against the support surface of the porous material while the machining operation is performed on the first sheet.

13. The method of claim 11, wherein performing the machining operation through the first surface comprises drilling holes through the first sheet.

14. The method of claim 11, further comprising inserting a vacuum port into the porous material.

15. The method of claim 11, further comprising a backing jig coupled to wherein the machining support comprises a backing plate.

16. The method of claim 11, wherein the first sheet comprises a contoured sheet.

17. The method of claim 11, wherein the first sheet comprises a panel.

18. The method of claim 17, wherein the panel comprises an aesthetic panel.

19. The method of claim 11, wherein performing the machining operation through the first surface comprises milling through the first sheet.

20. The method of claim 11, wherein performing the machining operation through the first surface comprises routing through the first sheet.

* * * * *